United States Patent
Chen et al.

(10) Patent No.: US 9,997,609 B2
(45) Date of Patent: Jun. 12, 2018

(54) IMPLANTATION FORMED METAL-INSULATOR-SEMICONDUCTOR (MIS) CONTACTS

(71) Applicant: International Business Machines Corporation, Armonk, NY (US)

(72) Inventors: Chia-Yu Chen, Yorktown Heights, NY (US); Zuoguang Liu, Schenectady, NY (US); Tenko Yamashita, Schenectady, NY (US); Chun-Chen Yeh, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days. days.

(21) Appl. No.: 15/068,958

(22) Filed: Mar. 14, 2016

(65) Prior Publication Data
US 2016/0211342 A1   Jul. 21, 2016

Related U.S. Application Data

(62) Division of application No. 14/600,077, filed on Jan. 20, 2015, now Pat. No. 9,391,152.

(51) Int. Cl.
*H01L 29/49*   (2006.01)
*H01L 29/45*   (2006.01)
(Continued)

(52) U.S. Cl.
CPC ........ *H01L 29/49* (2013.01); *H01L 21/02244* (2013.01); *H01L 21/02255* (2013.01);
(Continued)

(58) Field of Classification Search
CPC .............. H01L 29/49; H01L 21/02224; H01L 21/02255; H01L 21/26513;
(Continued)

(56) References Cited

U.S. PATENT DOCUMENTS

| | | | |
|---|---|---|---|
| 6,703,277 B1 * | 3/2004 | Paton ................ | H01L 21/28176 257/E21.01 |
| 9,390,939 B2 | 7/2016 | Xie et al. | |

(Continued)

OTHER PUBLICATIONS

List of IBM Patents or Patent Applications Treated as Related; (Appendix P), Filed Mar. 14, 2016; 2 pages.
(Continued)

*Primary Examiner* — Julio J Maldonado
*Assistant Examiner* — Farun Lu
(74) *Attorney, Agent, or Firm* — Cantor Colburn LLP; Vazken Alexanian

(57) ABSTRACT

A method of forming a metal-insulator-semiconductor (MIS) contact, a transistor including the MIS contact, and the MIS contact are described. The method includes etching an opening for formation of the contact, the opening extending to an upper surface of a semiconductor region. The method also includes implanting metal ions at a selected depth within the upper surface of the semiconductor region and converting the upper surface of the semiconductor region to a metal oxide insulating layer. The method further includes forming a metal layer on the insulating layer.

9 Claims, 7 Drawing Sheets

(51) Int. Cl.
*H01L 29/417* (2006.01)
*H01L 21/285* (2006.01)
*H01L 21/311* (2006.01)
*H01L 21/265* (2006.01)
*H01L 21/02* (2006.01)
*H01L 21/321* (2006.01)
*H01L 23/532* (2006.01)
*H01L 23/535* (2006.01)
*H01L 29/51* (2006.01)
*H01L 29/78* (2006.01)
*H01L 23/485* (2006.01)
*H01L 21/768* (2006.01)

(52) U.S. Cl.
CPC .. *H01L 21/26506* (2013.01); *H01L 21/26513* (2013.01); *H01L 21/285* (2013.01); *H01L 21/28568* (2013.01); *H01L 21/31116* (2013.01); *H01L 21/3212* (2013.01); *H01L 21/76814* (2013.01); *H01L 23/485* (2013.01); *H01L 23/535* (2013.01); *H01L 23/53266* (2013.01); *H01L 29/41725* (2013.01); *H01L 29/45* (2013.01); *H01L 29/4958* (2013.01); *H01L 29/4966* (2013.01); *H01L 29/517* (2013.01); *H01L 29/7851* (2013.01); *H01L 21/76831* (2013.01); *H01L 29/78* (2013.01); *H01L 2924/0002* (2013.01)

(58) Field of Classification Search
CPC ......... H01L 21/28568; H01L 21/31116; H01L 21/3212; H01L 23/53266; H01L 23/535; H01L 29/41725; H01L 29/45; H01L 29/4958; H01L 29/4966
See application file for complete search history.

(56) References Cited

U.S. PATENT DOCUMENTS

2006/0197154 A1* 9/2006 Pelella ............ H01L 21/823481
257/347
2010/0155846 A1 6/2010 Mukherjee et al.
2014/0264494 A1* 9/2014 Xu .................... H01L 29/41725
257/288
2016/0049370 A1 2/2016 Kamineni et al.

OTHER PUBLICATIONS

Chia-Yu Chen et al., "Implantation Formed Metal-Insulator-Semiconductor (MIS) Contacts", U.S. Appl. No. 14/600,077, filed Jan. 20, 2015.
Chia-Yu Chen et al., "Implantation Formed Metal-Insulator-Semiconductor (MIS) Contacts", U.S. Appl. No. 15/068,973, filed Mar. 14, 2016.

* cited by examiner

US 9,997,609 B2

IMPLANTATION FORMED METAL-INSULATOR-SEMICONDUCTOR (MIS) CONTACTS

DOMESTIC BENEFIT/NATIONAL STAGE INFORMATION

This application is a division of U.S. application Ser. No. 14/600,077 filed Jan. 20, 2015, the disclosure of which is incorporated by reference herein in its entirety.

BACKGROUND

The present invention relates to transistors, and more specifically, to implantation formed metal-insulator-semiconductor (MIS) contacts in transistors.

A field effect transistor (FET) generally includes three terminals: a source, a drain, and a gate. A critical factor in the performance of a FET is the external source-drain resistance (Rext) or the resistance at the source and drain contacts. Silicide (silicon bonded to metal) has been used for the source and drain contacts, but silicide contact resistance is a significant contributor to Rext. Metal-insulator-semiconductor (MIS) contacts have been considered as an alternative to silicide. MIS contacts are formed by depositing an insulating layer between the source and drain contacts and the respective source and drain regions. In theory, MIS contacts provide lower resistance based on a thin enough insulating layer.

SUMMARY

According to one embodiment of the present invention, a method of forming a metal-insulator-semiconductor (MIS) contact includes etching an opening for formation of the contact, the opening extending to an upper surface of a semiconductor region; implanting metal ions at a selected depth within the upper surface of the semiconductor region; converting the upper surface of the semiconductor region to a metal oxide insulating layer; and forming a metal layer on the insulating layer.

According to another embodiment, a transistor includes a source terminal; a source contact formed on the source terminal; a drain terminal separated from the source terminal by a gate terminal; and a drain contact formed on the drain terminal, wherein the source contact and the drain contact are metal-insulator-semiconductor (MIS) contacts, and the insulator of the MIS contacts is formed via oxidation of an upper surface of the source terminal and the drain terminal, respectively, following implantation of metal ions into the upper surface.

According to yet another embodiment, a metal-insulator-silicon (MIS) contact for a terminal of a transistor includes the terminal formed from a semiconductor material; an insulating layer formed through oxidation of a surface portion of the terminal following implantation of metal ions; and a metal layer.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 2-6 are cross-sectional views illustrating process steps involved in fabricating the source contact and drain contact according to an embodiment of the invention, in which:

FIG. 2 shows an intermediate structure used to start the process of contact formation;

FIG. 3 shows the intermediate structure resulting from etching contact openings into the structure of FIG. 2;

FIG. 4 illustrates metal ion implantation in the contact openings shown in FIG. 3;

FIG. 5 illustrates the insulating layer resulting from the metal ion implantation shown in FIG. 4;

FIG. 6 shows the source and drain contacts formed as MIS contacts with metal ion implantation into the insulating layer according to the embodiment.

DETAILED DESCRIPTION

As noted above, Rext is a critical factor in transistor performance. On the one hand, silicide contact resistance reduction has proven challenging, in that traditional silicides such as nickel silicide (NiSi) and titanium silicide (TiSi) may not be able to provide the desired contact resistance. On the other hand, the lower resistance for MIS contacts that is predicted in theory has been difficult to achieve in practice. The higher resistance seen from MIS contact formation is thought to be related to conventional deposition techniques with respect to the insulating layer, suggesting that the resulting thickness of the insulating layer is too great to achieve the desired results. Accordingly, disclosed herein are embodiments of methods and corresponding structures for lowering Rext by forming MIS contacts based on implantation of metal in a thin insulating layer rather than deposition of metal over a thicker insulating layer.

Figure 1:
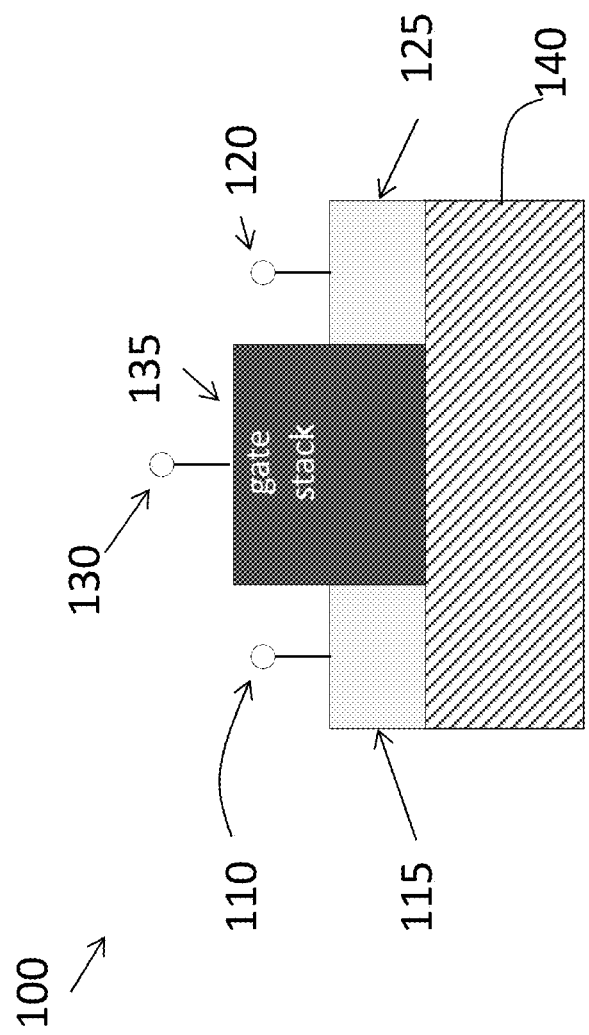
FIG. 1 is a cross-sectional view of a transistor with source contact and a drain contact according to embodiments of the invention.

Referring generally now to the figures, FIG. 1 is a cross-sectional view of an FET 100 with a source contact 110, drain contact 120, and gate contact 130 according to embodiments of the invention. The contacts 110, 120, 130 are not detailed in FIG. 1. Instead, an overall arrangement of the transistor 100 structure is provided, noting that the processes detailed below are not limited to any particular type of transistor. In addition, while epitaxially grown source 115 and drain 125 are used in the exemplary figures, the processes discussed herein apply, as well, to implanted source and drain regions. The three FET terminals shown for the exemplary transistor 100, i.e., the source 115, the drain 125, and the gate 135 have the source contact 110, the drain contact 120, and the gate contact 130 associated with them, respectively. The source and drain 115, 125 may be formed over a semiconductor substrate 140. The formation of the source contact 110 and drain contact 120 as implantation-formed MIS contacts is detailed below.

FIGS. 2-6 are cross-sectional views illustrating process steps involved in fabricating the source contact 110 and drain contact 120 according to an embodiment of the invention. It will be appreciated that the present embodiments apply to a planar FET structure or a three-dimensional FET structure (e.g., finFET). The intermediate structure 200 shown in FIG. 2 includes a source 115 and a drain 125 formed on the substrate 140. In the illustrated embodiment, the source 115 and drain 125 may be elevated (i.e., raised) by growing a selective epitaxial silicon on the substrate 140. It will also be appreciated that the source 115 and drain 120 may be formed by other processes, such as implanting dopant atoms into a semiconductor substrate, for example. An oxide layer 210 (e.g., silicon dioxide ($SiO_2$)) is formed over the source 115 and drain 125, as well as over a gate stack 220. A silicon nitride (SiN) layer 230 is formed over the oxide layer 210 as an etch and ion implantation mask.

Figure 2:
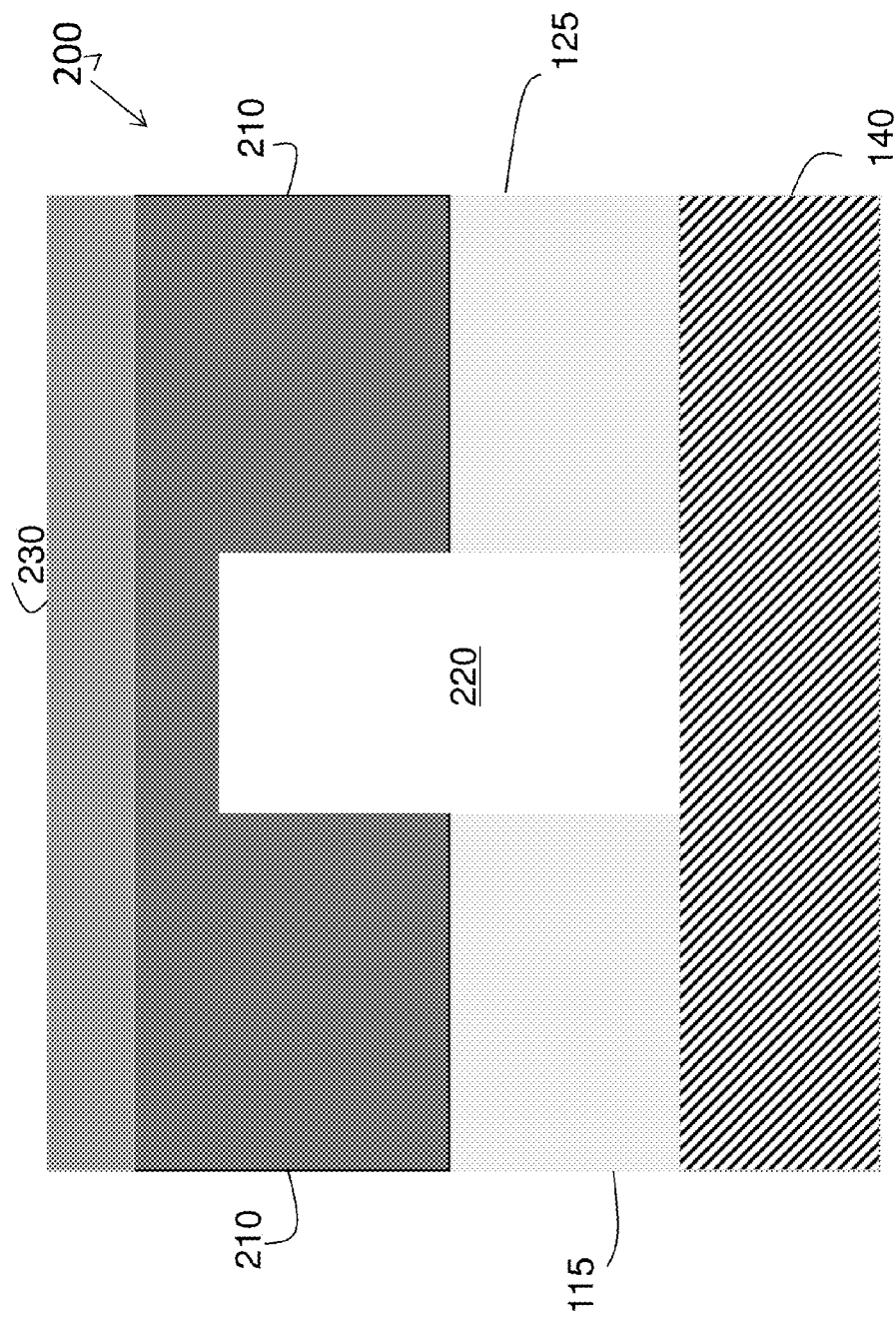
Figure 3:
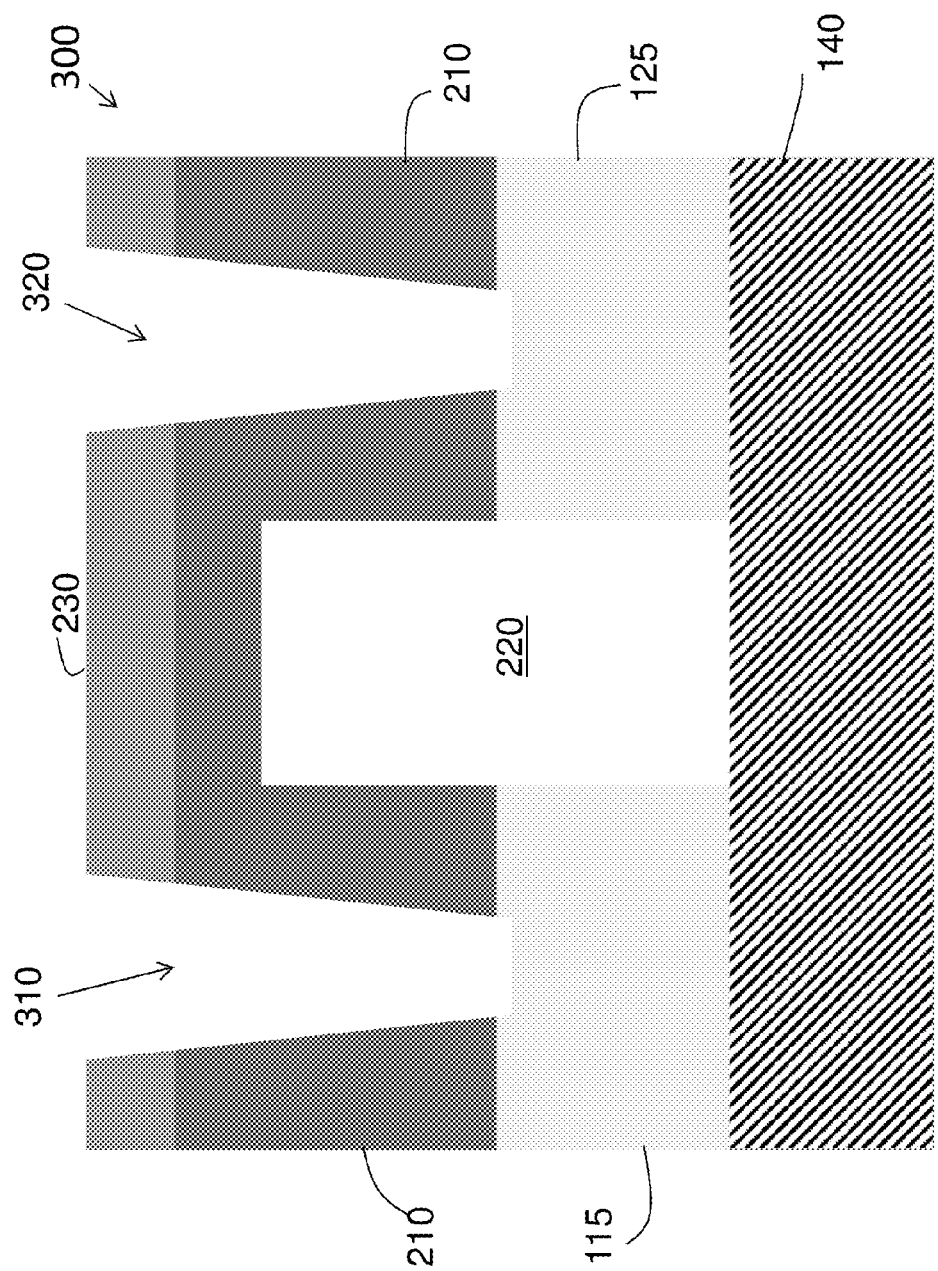
Figure 4:
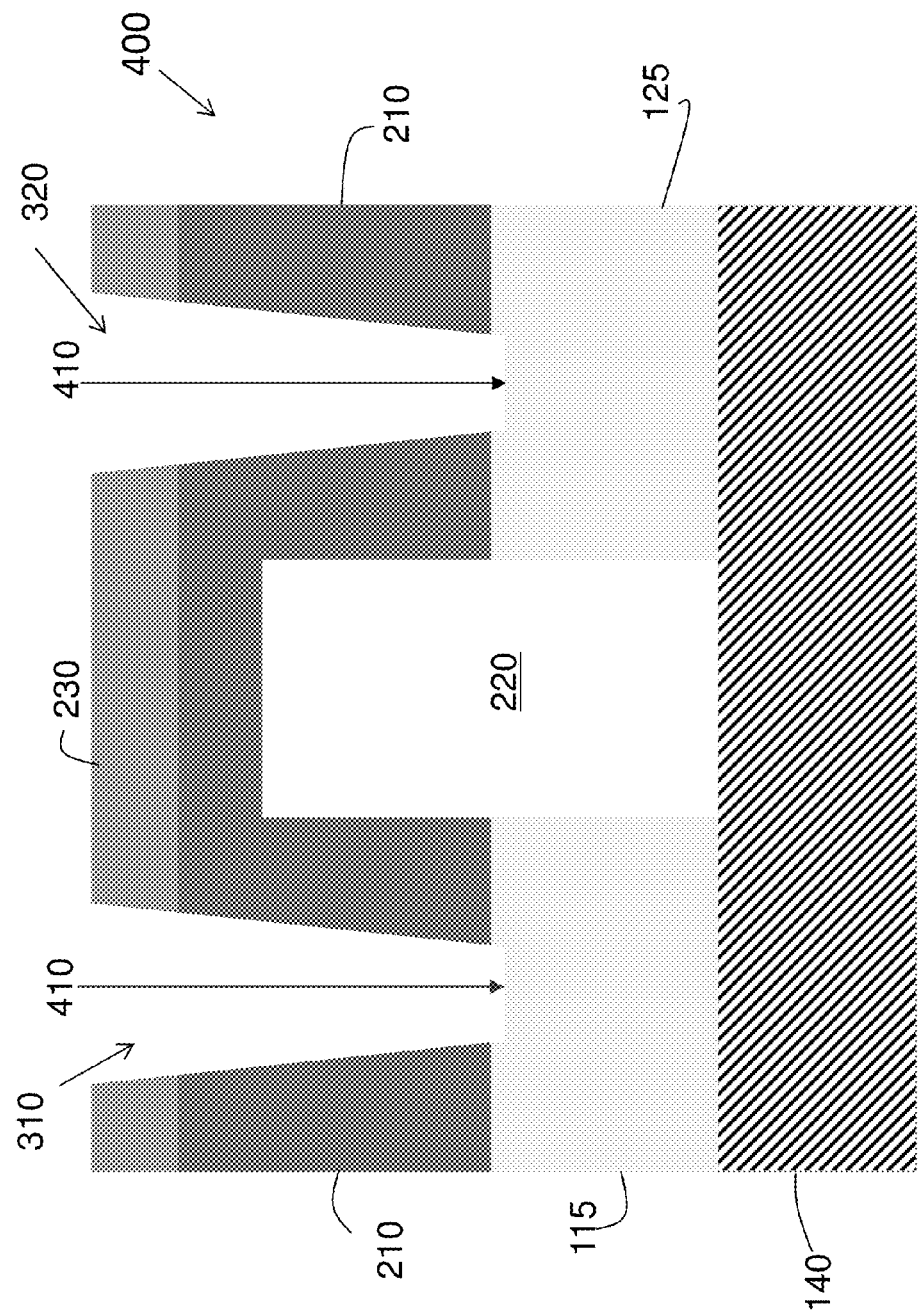

FIG. 3 illustrates a cross-sectional view of an intermediate structure 300 resulting from etching a source contact opening 310 and a drain contact opening 320 in the structure 200 shown in FIG. 2. The two contact openings 310, 320 are etched through a dry etching process such as a reactive ion etch (RIE) process to expose a top surface of the source 115 and drain 125. The etch may extend partially into the semiconductor material of the source 115 and drain 125 as well. The contact openings 310, 320 may be etched simultaneously. Alternately, based on alignment issues arising from formation of multiple devices, for example, the RIE process may be performed separately to obtain each contact opening 310, 320. FIG. 4 illustrates the intermediate structure 400 and shows a key process in the formation of the source contact 110 and drain contact 120 according to the embodiment detailed herein. Metal ions 410 are implanted into an upper region of the source 115 and drain 125. The metal ions 410 may be aluminum (Al), lanthanum (La), zinc (Zn), or titanium (Ti), for example. The metal ion 410 implantation depth may be tuned. The result of the tuning is a very thin insulating layer 510 (FIG. 5) that results in low Rext. The metal ion 410 implantation may be performed in a vacuum.

Figure 5:
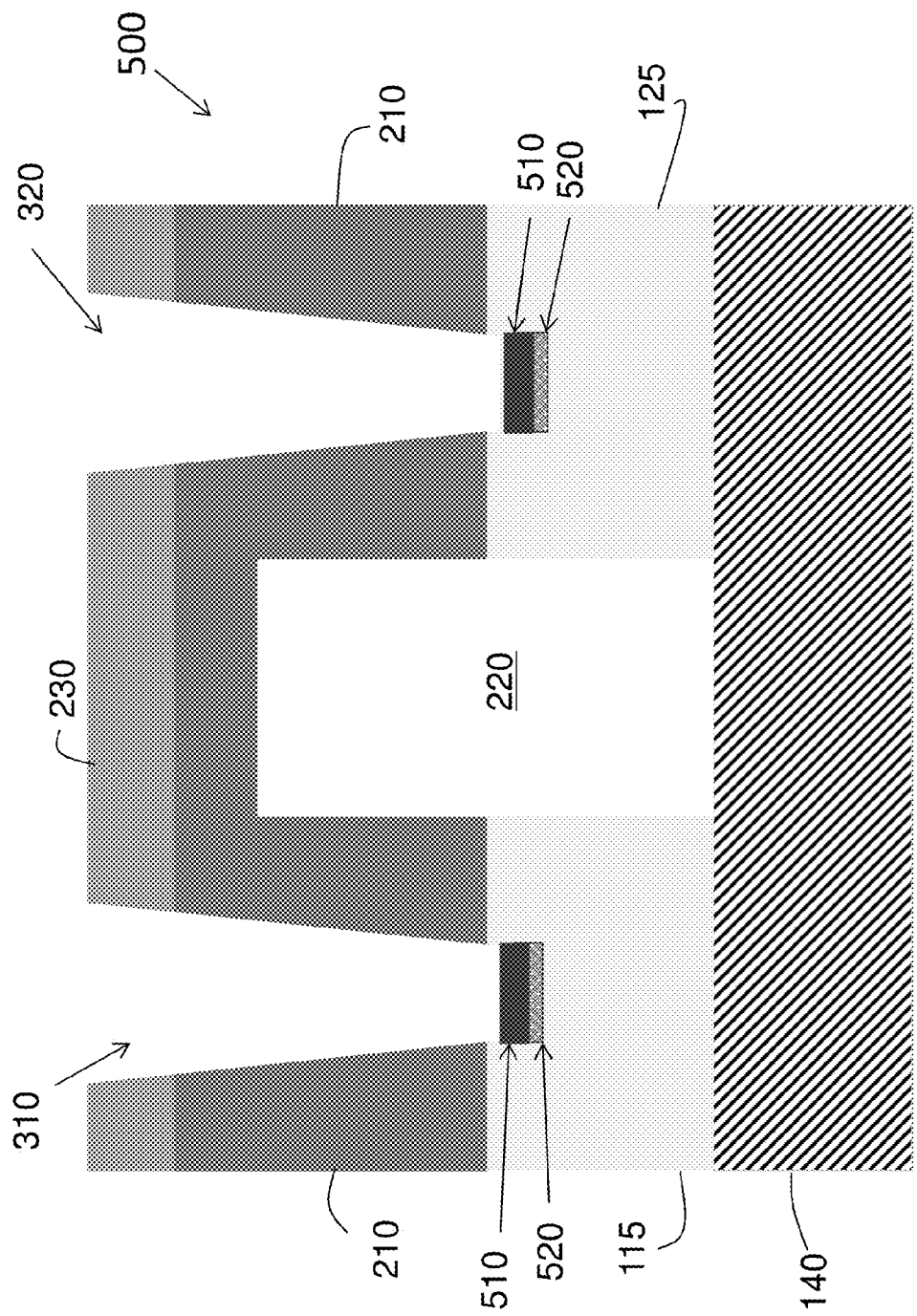

FIG. 5 shows the intermediate structure 500 resulting from the metal ion 410 implantation shown in FIG. 4, followed by oxidation to convert the implanted upper region of the source 115 and drain 125 to a thin metal oxide insulating layer 510. The oxidation, according to one embodiment, is achieved from exposure to air and may be aided, optionally, by implantation of oxygen or deposition of oxygen plasma, for example. Thermal treatment (thermal anneal) may be used after the metal ion 410 implantation to aid in the formation of the oxide as well. Depending on the metal ion 410 that was implanted, aluminum oxide ($Al_2O_3$), lanthanum oxide ($LaO_x$), zinc oxide ($ZnO_2$), or titanium dioxide ($TiO_2$) may be formed. The result of the oxidation is a metal oxide insulating layer 510 and an intermixing layer 520 below it. When the metal ions 410 are first implanted, they exist interstitially at the top surface of the source 115 and drain 125. Through the oxidation process, the insulating layer 510 is formed. As a result of diffusion, the intermixing layer 520, between the oxide and semiconductor (source 115 or drain 125), may also result. As a result of the metal ion 410 implantation, the resulting insulating layer 510 is thinner than the thickness (~2 nanometers (nm)) of a typical insulating layer of an MIS contact. The insulating layer 510 according to the embodiment discussed herein may be less than 1 nm thick.

Figure 6:
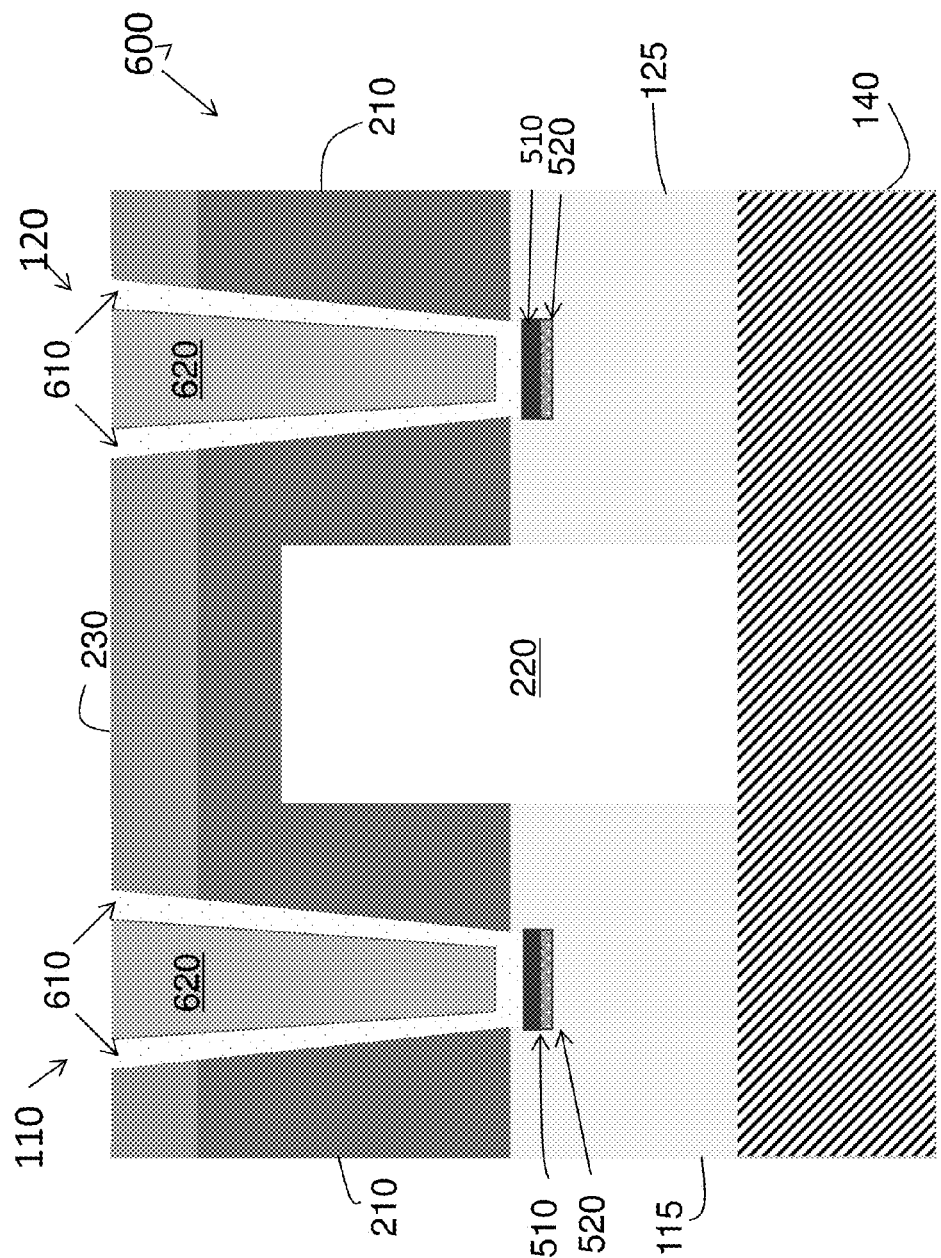

FIG. 6 shows the MIS contacts 110, 120 formed following the metal ion 410 implantation and conversion of the ions to the metal oxide insulating layer 510. In addition to the insulating layer 510, the structure 600 shown in FIG. 6 also includes a metal liner 610 and a metal fill 620, formed by metal fill process as known in the art. As FIG. 6 shows, the metal liner 610 is conformally deposited on the surfaces of the openings 310, 320 and on the insulating layer 510. The metal liner 610 may be Ti and titanium nitride (TiN), for example. A metal fill 620 (e.g., tungsten (W)) is then deposited in the openings 310, 320 over the metal liner 610. A chemical-mechanical polishing (CMP) process is also performed to the structure 600 shown in FIG. 6 following deposition of the metal fill 620. This completes formation of the source contact 110 and drain contact 120. As noted above, Rext is reduced in the source contact 110 and drain contact 120, which are MIS contacts formed by implantation of metal ions 410 in the insulating layer 510 rather than deposition of a metal layer over an insulating layer. The resulting MIS contact 110, 120 is comprised of the metal fill 620 (metal), insulating layer 510 (insulator), and source 115 or drain 125 semiconductor surfaces (semiconductor).

Figure 7:
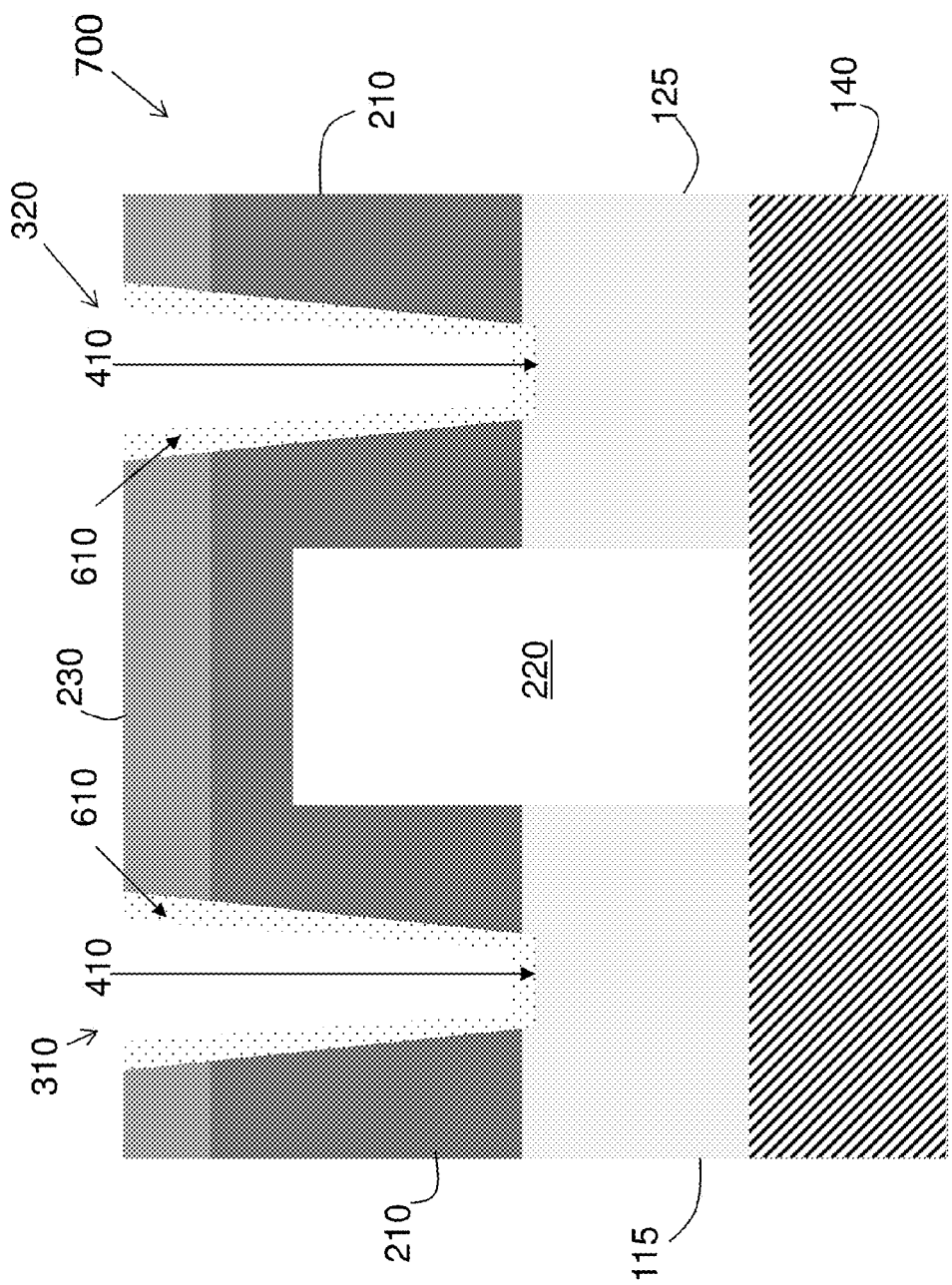
FIG. 7 is a cross-sectional view illustrating a process step involved in fabricating the source contact and drain contact according to another embodiment of the invention.

FIG. 7 is a cross-sectional view illustrating a process step involved in fabricating the source contact 110 and drain contact 125 according to another embodiment of the invention. FIG. 7 illustrates an intermediate structure 700 that shows an alternate embodiment of the process shown in FIG. 4. Specifically, the metal liner 610 is conformally deposited in the source contact opening 310 and in the drain contact opening 320 prior to implantation of the metal ions 410 and conversion to a metal oxide insulating layer 510. Following the metal fill 620 and CMP process, the structure 600 that includes the source contact 110 and drain contact 120, as shown in FIG. 6, is obtained from the structure 700 of FIG. 7. Again, the metal ion 410 implantation depth is selected to create a thin insulating layer 510. Also, thermal treatment may be applied to help the formation of an oxide (e.g., $Al_2O_3$, $LaO_x$, $ZnO_2$, $TiO_2$).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A transistor, comprising
a source terminal;
a source contact formed on the source terminal;
a drain terminal separated from the source terminal by a gate terminal; and
a drain contact formed on the drain terminal, wherein
the source contact and the drain contact are metal-insulator-semiconductor (MIS) contacts,
the insulator of the MIS contacts is formed via oxidation of an upper surface of the source terminal and the drain terminal, respectively, following implantation of metal ions into the upper surface; and
the semiconductor of the MIS contact, which separates the insulator from the upper surface of the source terminal and the drain terminal, respectively, includes metal ions based on the implantation of the metal ions.

2. The transistor according to claim 1, wherein the insulator has a thickness less than 2 nanometers.

3. The transistor according to claim 2, wherein the insulator has the thickness less than 1 nanometer.

4. The transistor according to claim 1, wherein the metal ions are comprised of aluminum, lanthanum, zinc, or titanium ions.

5. The transistor according to claim 1, wherein the source contact and the drain contact also include a metal liner and a metal fill.

6. The transistor according to claim 5, wherein the metal liner is comprised of titanium and titanium nitride.

7. The transistor according to claim 5, wherein the metal liner is formed conformally on an inner surface of the source contact and the drain contact prior to implantation of the metal ions.

8. The transistor according to claim 5, wherein the metal liner is formed conformally on an inner surface of the source contact and the drain contact and on the insulating layer following implantation of the metal ions and formation of the insulating layer.

9. The transistor according to claim 1, wherein the insulator is aluminum oxide ($Al_2O_3$), lanthanum oxide ($LaO_x$), zinc peroxide ($ZnO_2$), or titanium dioxide ($TiO_2$).

* * * * *